(12) United States Patent
Peng

(10) Patent No.: US 12,047,662 B2
(45) Date of Patent: Jul. 23, 2024

(54) CAMERA MODULE AND MANUFACTURING METHOD THEREOF

(71) Applicant: TRIPLE WIN TECHNOLOGY(SHENZHEN) CO. LTD., Shenzhen (CN)

(72) Inventor: Kuei-Feng Peng, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 112 days.

(21) Appl. No.: 18/076,295

(22) Filed: Dec. 6, 2022

(65) Prior Publication Data

US 2024/0089571 A1 Mar. 14, 2024

(30) Foreign Application Priority Data

Sep. 8, 2022 (CN) .......................... 202211098018.0

(51) Int. Cl.
| | |
|---|---|
| *H04N 23/54* | (2023.01) |
| *H04N 23/57* | (2023.01) |
| *H05K 1/11* | (2006.01) |
| *H05K 1/14* | (2006.01) |
| *H05K 1/18* | (2006.01) |
| *H05K 3/32* | (2006.01) |

(Continued)

(52) U.S. Cl.
CPC ............. *H04N 23/54* (2023.01); *H04N 23/57* (2023.01); *H05K 1/115* (2013.01); *H05K 1/147* (2013.01); *H05K 1/18* (2013.01); *H05K 1/184* (2013.01); *H05K 3/32* (2013.01); *H05K 3/365* (2013.01); *H05K 3/368* (2013.01); *H05K 3/4038* (2013.01); *H05K 2201/10151* (2013.01); *H05K 2201/10734* (2013.01)

(58) Field of Classification Search
None
See application file for complete search history.

(56) References Cited

U.S. PATENT DOCUMENTS

| | | | | |
|---|---|---|---|---|
| 2007/0236596 | A1* | 10/2007 | Sekine | H04N 23/57 348/340 |
| 2008/0303939 | A1* | 12/2008 | Hsu | H04N 23/57 348/340 |

(Continued)

FOREIGN PATENT DOCUMENTS

| | | | |
|---|---|---|---|
| CN | 108323034 A | * | 7/2018 |
| TW | 200841460 | | 10/2008 |
| TW | 202218173 | | 5/2022 |

*Primary Examiner* — Paul M Berardesca
(74) *Attorney, Agent, or Firm* — ScienBiziP, P.C.

(57) ABSTRACT

A camera module of reduced overall height includes multiple electronic components embedded in a PCB, multiple first holes defined on the PCB, each first hole enables a connection with one electronic component. A sensor chip is attached to the PCB by anisotropic conductive adhesive, multiple conductive balls on the sensor chip enter the multiple first holes and connect with the multiple electronic components. The embedded electronic components and the PCB form an integrated and single structure, avoiding multiple installations of electronic components one by one into the board and simplifying the manufacturing process of the camera module. The multiple conductive balls sinking into the multiple first holes reduce overall size of the camera module. A method for manufacturing the camera is also disclosed.

10 Claims, 3 Drawing Sheets

(51) Int. Cl.
  *H05K 3/36*    (2006.01)
  *H05K 3/40*    (2006.01)

(56) References Cited

U.S. PATENT DOCUMENTS

2011/0273600 A1* 11/2011 Kriman .................. H04N 23/57
                                                         348/294
2012/0248294 A1* 10/2012 Kohama ........... H01L 27/14625
                                                        250/214 P
2022/0407987 A1* 12/2022 Han ....................... H04N 23/55

* cited by examiner

CAMERA MODULE AND MANUFACTURING METHOD THEREOF

CROSS-REFERENCE TO RELATED APPLICATION

This application claims priority to China Application No. 202211098018.0, having a filing date of Sep. 8, 2022, filed in China State Intellectual Property Administration, the entire contents of which are hereby incorporate by reference.

FIELD

The subject matter relates to camera manufacturing technologies, and more particularly to a camera module and a manufacturing method of the camera module.

BACKGROUND

A camera module includes a plurality of lenses, a sensor chip, multiple electronic components, and a printed circuit board (PCB) stacked in turn, the electronic components are arranged on the PCB and coupled to the sensor chip. During manufacturing processes, the electronic components are mounted on the PCB, then the lenses and the sensor chip are mounted.

However, the electronic components are mounted on the PCB one by one, which requires multiple installations, each requires high precision, and a lot of empty space on the PCB, resulting in complex manufacturing processes and a large size of the camera module.

SUMMARY

An objective of the present disclosure is achieved by providing a manufacturing method of a camera module and the camera module.

According to a first aspect of the application, a manufacturing method of a camera module is provided. The manufacturing method comprises: embedding multiple electronic components in a printed circuit board; defining multiple first holes on a first surface of the printed circuit board, each first hole connecting the first surface with one of the multiple electronic components, the first surface facing a sensor chip; attaching the sensor chip to a lens and arranging multiple conductive balls on a side of the sensor chip away from the lens; and attaching the sensor chip to the printed circuit board by a first Anisotropic Conductive Film, each of the conductive balls being inserted into a corresponding one of the multiple first holes, the multiple conductive balls connecting with the multiple electronic components.

According to a second aspect of the application, a camera module is provided. The camera module comprising a lens, a sensor chip, multiple conductive balls coupled to the sensor chip, and a printed circuit board. The sensor chip is attached the lens, the printed circuit board is arranged with multiple electronic components embedded therein. The multiple conductive balls protrude from a side of the sensor chip away from the lens, the printed circuit board is defined with multiple first holes on a first surface, each first hole connecting the first surface with a corresponding one of the multiple electronic components, and the printed circuit board being attached to the sensor chip on the first surface, and each conductive ball being inserted into a corresponding one of the multiple first holes and connecting with the corresponding one of the multiple electronic components.

BRIEF DESCRIPTION OF THE DRAWINGS

Implementations of the present technology will now be described, by way of example only, with reference to the attached figures.

DETAILED DESCRIPTION

Figure 1:
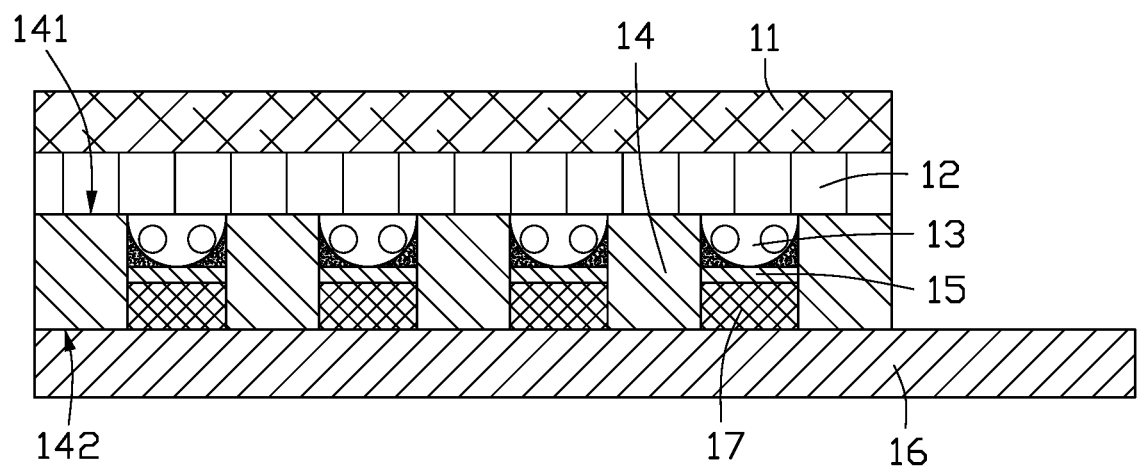
FIG. 1 is a cross section view of a camera module according to an embodiment of the present disclosure.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the present application, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Figure 2:
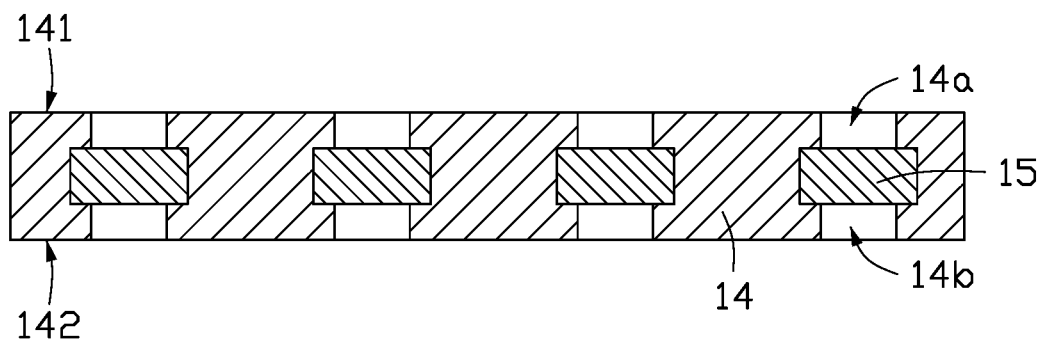
FIG. 2 is a cross section view of the PCB and the electronic components in FIG. 1.

Referring to FIG. 1 and FIG. 2, a camera module 10 is provided, the camera module 10 includes a lens 11, a sensor chip 12, multiple conductive balls 13 mounted on the sensor chip 12, and a printed circuit board (PCB) 14. A fixed attachment is made between the sensor chip 12 and the lens 11, the multiple conductive balls 13 protrude from a side of the sensor chip 12 away from the lens 11, and multiple electronic components 15 are embedded in the PCB 14. The PCB 14 has a first surface 141 facing the sensor chip 12 and a second surface 142 facing away from the sensor chip 12, multiple first holes 14a are defined in the PCB 14, and each first hole 14a connecting the first surface 141 with one of the multiple electronic components 15. The sensor chip 12 and the multiple conductive balls 13 are attached to the PCB 14 by a first Anisotropic Conductive Film (ACF), each conductive ball 13 is inserted into one of the multiple first holes 14a and connects with the one electronic component 15.

In the camera module 10, the multiple electronic components 15 are combined with the PCB 14 by being embedded into the PCB, the sensor chip 12 and the multiple conductive balls 13 are attached to the PCB 14 by the first ACF, the multiple conductive balls 13 protrude from the PCB 14 into the multiple first holes 14a, and connect with the electronic components 15 correspondingly, which reduces an overall size of the camera module.

According to further embodiments, the electronic components 15 include at least one of resistors, inductors, and capacitors. Specifically, the multiple electronic components 15 are independently selected from: resistors, inductors, capacitors, and any combination thereof.

Referring to FIG. 1 and FIG. 2, in further embodiments, there are multiple second holes 14b defined in the PCB 14, each second hole 14b connects the second surface 142 with one of the multiple electronic components 15. The camera module 10 further includes a flexible printed board (FPC) 16, multiple conductive bulges 17 protrude from the FPC 16. The FPC 16 is attached to the PCB 14 on the second surface of the PCB 14 by a second ACF, each conductive bulge 17 protrudes into one of the multiple second holes 14b and connects with the one electronic component 15.

The first holes 14a and the second holes 14b allow the PCB 14 to be connected to other components on both sides, and the range of service of the PCB 14 is extended. The FPC 16 provides flexibility for the camera module 10, wear and tear of the PCB 14 due to rigid connect with other components is avoided and conductivity of the camera module 10 is improved. The configuration of the conductive bulges 17 and the second holes 14b reduces the entire thickness of the FPC 16 and the PCB 14 after final gluing together.

According to further embodiments, the multiple first holes 14a and the multiple second holes 14b are arranged in an array on the first surface 141 and the second surface 142 respectively, and each first hole 14a is aligned with a respective second hole 14b, which simplifies a manufacturing process of the PCB 14 and reduces a cost of the PCB 14.

Figure 3:
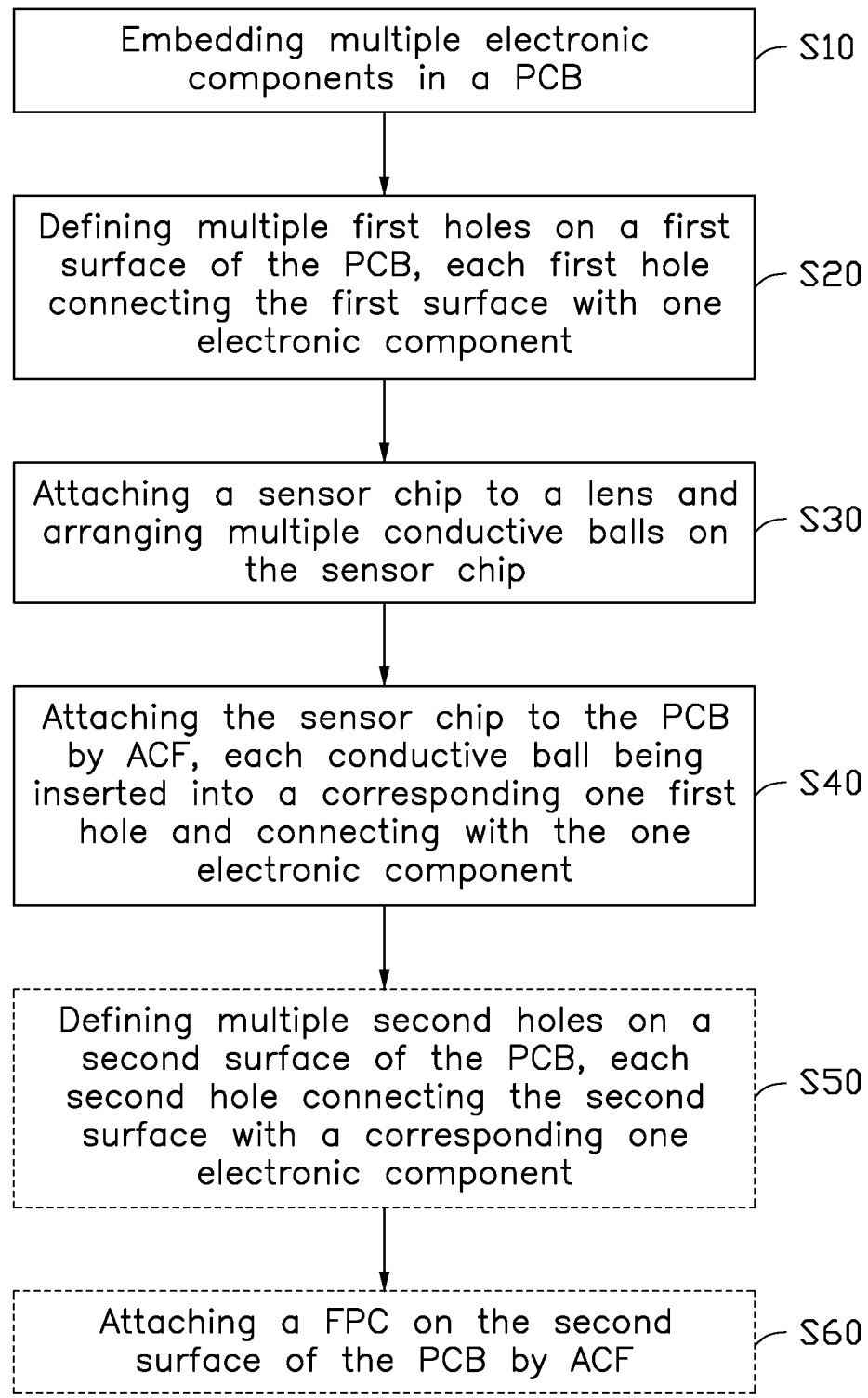
FIG. 3 is a flow chart of a manufacturing method of the camera module of an embodiment of the present disclosure.

Referring to FIG. 1 and FIG. 3, a manufacturing method of the camera module 10 is provided, comprising:

S10: embedding multiple electronic components 15 in a printed circuit board (PCB) 14.

In some embodiments, the electronic components 15 can be resistors, inductors, and capacitors. Specifically, the multiple electronic components 15 are independently selected from: resistors, inductors, capacitors, and any combination thereof.

S20: defining multiple first holes 14a on a first surface of the PCB 14, each first hole 14a connecting with one of the multiple electronic components 15.

Specifically, the first holes 14a are Through-Silicon-Via (TSV) holes defined by a TSV process. The first holes 14a reduces a length of electrical interconnection between the components in a vertical direction, which reduces delay of transmitting signals, decreases capacitance/inductance, enables low power consumption, and high speed communication.

S30: attaching a sensor chip 12 to a lens 11 and arranging multiple conductive balls 13 on a side of the sensor chip 12 away from the lens 11.

In further embodiments, the sensor chip 12 is attached to the lens 11 by a Ball Grid Array (BGA), which reduces space occupied by the attachment and provides a connection between the sensor chip 12 and the lens 11.

S40: attaching the sensor chip 12 and the multiple conductive balls 13 to the first surface 141 of the PCB 14 by a first Anisotropic Conductive Film (ACF), each conductive balls 13 entering one of the multiple first holes 14a and so connecting with an electronic component 15.

By using the first ACF to attach the sensor chip 12 and the multiple conductive balls 13 to the PCB 14, the space occupied by the attachment is reduced and the sensor chip 12 with the multiple conductive balls 13 and the lens 11 are firmly connected.

In the manufacturing method of the camera module 10, the multiple electronic components 15 are combined with the PCB 14 by embedment in the PCB, then the multiple electronic components 15 and the PCB 14 form an integrated structure, and the integrated structure can be handled as a single unit in operation, which avoids multiple installations of the multiple electronic components 15, and simplifies the manufacturing process of the camera module 10. Further, by using the first ACF to attach the sensor chip 12 and the multiple conductive balls 13 to the PCB 14 and inserting the multiple conductive balls 13 into the multiple first holes 14a for connecting with the electronic components 15 correspondingly, an overall size of the camera module 10 is reduced.

Referring to FIG. 1 and FIG. 3, in further embodiments, the manufacturing method of the camera module 10 includes:

S50: defining multiple second holes 14b on a second surface 142 of the PCB 14, each second hole 14b connecting the second surface 142 with one of the multiple electronic components 15, the second surface 142 being opposite to the first surface 141.

Specifically, the second holes 14b are Through-Silicon-Via (TSV) holes defined by a TSV process. The second holes 14b reduce electrical interconnection length between the components in a vertical direction, reducing delay of transmitting signals, decreases capacitance/inductance, and enables a low power consumption, and high-speed operation.

S60: attaching a flexible printed circuit board (FPC) 16 to the PCB 14 by a second ACF.

In particular, the FPC 16 is arranged with multiple conductive bulges 17, the multiple conductive bulges 17 protrude from the FPC 17 towards the PCB 14. As the FPC 16 is attached to the PCB 14, each conductive bulge 17 enters into one of the multiple second holes 14b and connects with an electronic component 15.

Therefore, the first holes 14a and the second holes 14b allow the PCB 14 to be connected to other components on both sides, and extends a service range of the PCB 14. The FPC 16 provides flexibility for the camera module 10, avoiding wear and tear of the PCB 14 due to rigid connect with other components and improving conductivity of the camera module 10. Further, a configuration of the conductive bulges 17 and the second holes 14b reduces the entire finished thickness of the FPC 16 and the PCB 14 after gluing together.

According to further embodiments, the multiple first holes 14a and the multiple second holes 14b are arranged in an array on the first surface 141 and the second surface 142 respectively, and each first hole 14a is aligned with a respective second hole 14b, which simplifies a manufacturing process of the PCB 14 and reduces a cost of the PCB 14.

While the invention has been described in detail in connection with only a limited number of embodiments, it should be readily understood for the skilled in the art that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A manufacturing method of the camera module, the manufacturing method comprising
embedding multiple electronic components in a printed circuit board;
defining multiple first holes on a first surface of the printed circuit board, each of the multiple first holes connecting the first surface with one of the multiple electronic components, the first surface facing a sensor chip;
attaching the sensor chip to a lens and arranging multiple conductive balls on a side of the sensor chip away from the lens; and
attaching the sensor chip to the printed circuit board by Anisotropic Conductive Film (ACF), each of the multiple conductive balls being inserted into a corresponding one of the multiple first holes, the multiple conductive balls connecting with the multiple electronic components.

2. The manufacturing method of the camera module of claim 1, wherein
the electronic components comprise at least one of resistors, inductors, and capacitors.

3. The manufacturing method of the camera module of claim 1, wherein
the sensor chip is attached to the lens by Ball Grid Array.

4. The manufacturing method of the camera module of claim 1, further comprising
defining multiple second holes on a second surface of the printed circuit board, each of the multiple second hole connecting the second surface with a corresponding one of the multiple electronic components, the second surface facing away from the sensor chip;
attaching a flexible printed circuit board on the second surface of the printed circuit board, wherein
the flexible printed circuit board is arranged with multiple conductive bulges, the multiple conductive bulges protrude from the flexible printed circuit board to the printed circuit board, each of the multiple conductive bulges is inserted into a corresponding one of the multiple second holes and connects with the corresponding electronic component when the flexible printed circuit board is attached to the printed circuit board.

5. The manufacturing method of the camera module of claim 4, wherein
the multiple first holes and the multiple second holes are Through-Silicon-Via (TSV) holes processed by a TSV process.

6. The manufacturing method of the camera module of claim 4, wherein
the multiple first holes are arranged in an array on the first surface, the multiple second holes are arranged in an array on the second surface correspondingly positioned relative to the multiple first holes, and each of the multiple first holes is aligned with a respective second hole of the multiple second holes.

7. A camera module comprising:
a lens;
a sensor chip attached the lens;
multiple conductive balls coupled to the sensor chip, the multiple conductive balls protruding from a side of the sensor chip away from the lens; and
a printed circuit board arranged with multiple electronic components embedded therein, multiple first holes being defined on a first surface of the printed circuit board, each of the multiple first holes connecting the first surface with a corresponding one of the multiple electronic components; wherein
the printed circuit board is attached to the sensor chip on the first surface, and each of the multiple conductive balls is inserted into one of a corresponding one of the multiple first holes and connects with the corresponding electronic component.

8. The camera module of claim 7, wherein
the electronic components comprise at least one of resistors, inductors, and capacitors.

9. The camera module of claim 7, further comprises
a flexible printed circuit board attached to the printed circuit board on a second surface of the printed circuit board by ACF, the second surface faces away from the sensor chip; wherein
multiple second holes are defined on the second surface of the printed circuit board, each second hole connects the second surface with one of the multiple electronic components;
the flexible printed circuit board is arranged with multiple conductive bulges, the multiple conductive bulges protrude from the flexible printed circuit board to the printed circuit board, each of the multiple conductive bulges is inserted into a corresponding one of the multiple second holes and connects with the corresponding one electronic component when the flexible printed circuit board is attached to the printed circuit board.

10. The camera module of claim 9, wherein
the multiple first holes are arranged in an array on the first surface, the multiple second holes are arranged in an array on the second surface correspondingly positioned relative to the multiple first holes, and each of the multiple first holes is aligned with a respective second hole of the multiple second holes.

* * * * *